United States Patent [19]

Rzeszewski

[11] 4,280,104
[45] Jul. 21, 1981

[54] PHASE LOCKED LOOP SYSTEM WITH IMPROVED ACQUISITION

[75] Inventor: Theodore S. Rzeszewski, Lombard, Ill.

[73] Assignee: Matsushita Electric Corporation of America, Franklin Park, Ill.

[21] Appl. No.: 65,589

[22] Filed: Aug. 10, 1979

[51] Int. Cl.³ .............................................. H03L 7/00
[52] U.S. Cl. ........................................ 331/1 A; 331/25
[58] Field of Search ................. 531/1 R, 1 A, 25, 18, 531/10, 11

[56] References Cited

U.S. PATENT DOCUMENTS 3,825,855   7/1974   Bassett et al. ......................... 331/11

Primary Examiner—David K. Moore
Attorney, Agent, or Firm—LaValle D. Ptak

[57] ABSTRACT

A phase locked loop system having improved acquisition time is particularly suitable for use in a television receiver with frequency synthesizer tuning. A conventional phase locked loop is modified by the addition of a pair of transmission gates and a frequency discriminator/detector. The transmission gates are normally open, and the phase locked loop system operates in a conventional manner. When a programmable frequency divider connected between the output of the voltage controlled oscillator and the input to the phase locked loop phase comparator has its division ratio changed to select a new channel, the frequency discriminator, which also is connected to the output of the programmable frequency divider, applies an appropriate gating signal to one or the other of the transmission gates to close that gate. The two gates are connected respectively to sources of direct current potential which operate rapidly to force the maximum control signal on the voltage controlled oscillator in the desired direction to produce acquisition until the phase locked loop is nearly locked. When the frequency at the output of the programmable frequency divider comes within a range which is a predetermined amount above or below the desired center frequency of the frequency discriminator, the output of the frequency discriminator terminates, opening the one of the transmission gates which previously was closed to return the system back to operation as a conventional phase locked loop system.

13 Claims, 3 Drawing Figures

PHASE LOCKED LOOP SYSTEM WITH IMPROVED ACQUISITION

BACKGROUND OF THE INVENTION

Phase locked loop oscillator circuits are in widespread use in a varied number of applications. Typical phase locked loop oscillator circuits include a voltage controlled oscillator, a phase detector, a source of reference signals and a loop filter. The voltage controlled oscillator produces an output signal having a frequency which is precisely controlled by referencing its phase to that of the reference frequency. The phase detector detects any phase error between the signal derived from the voltage controlled oscillator frequency and the signal derived from the reference frequency. The output of the phase detector is applied to the input of the loop filter the characteristics of which determine the characteristics of the phase locked loop. Finally the loop is closed by applying the output of the loop filter to a voltage control input terminal of the voltage controlled oscillator. By closing the feedback loop in this manner, the voltage controlled oscillator frequency tracks the reference signal frequency. When the phase of the signal derived from the voltage controlled oscillator frequencies properly tracks the phase of the signal derived from the reference frequency, the loop is in its locked operating condition.

The two signals applied to the phase detector often are not the same frequency at the start of operation or when a change in the tuning of a television receiver or the like is desired. When the signals are not of the same frequency, the phase difference between them constantly changes. This phase difference repeats itself once every 360 degrees of phase change, so that the output of the phase detector is an alternating current waveform which oscillates once for every 360 degrees of phase change. Various types of phase detectors are available, some of which produce a direct current component of the proper polarity for tuning the voltage controlled oscillator in the proper direction to ultimately establish lock-in of its operation, but even such phase detectors still have A.C. components in the outputs. Thus, the loop filter is necessary to smooth out these A.C. components and produce a direct current control voltage for the voltage controlled oscillator. Any A.C. components in the output of the filter which are not completely suppressed tend to frequency modulate the voltage controlled oscillator, which in most applications is an undesirable and detrimental condition.

As is apparent from the above description, the design of the loop filter is a key to the proper operation of the system. Necessarily, the loop filter characteristics are a compromise among different desirable characteristics of the operation of a phase locked loop. Loop filter designs which suppress all of the alternating current voltages from the phase detector outputs are often very slow in responding to frequency variations or changes between the two signals applied to the phase detector or phase comparator. For systems where sudden and fairly substantial changes in the frequency of the voltage controlled oscillator are desired, such as in television frequency synthesizer tuning systems, this slow response time is not desirable. A user of such a television receiver expects the receiver to nearly instantaneously tune to the newly selected channel and a slow pull-in or lock-in to a new channel prevents this from happening.

On the other hand, if the loop filter provides fast lock-up characteristics, the filter generally cannot suppress all of the alternating current voltages which are present in the output of the phase detector. Thus, even though relatively fast lock-up of the loop to the desired frequency takes place, continuous modulation or variation and change of the voltage controlled oscillator frequency is effected by the alternating current modulation permitted to pass from such a fast response time filter.

Attempts have been made in the past to overcome these seemingly incompatable demands placed upon the loop filter to modify phase locked loop systems to cause them to have relatively fast acquisition times and still have the stability provided by a loop filter otherwise exhibiting the characteristics of a slow response time. One such approach, is employed in the patent to LaFratta, U.S. Pat. No. 4,151,485, issued Apr. 24, 1979. In the LaFratta system, a digital clock signal is caused to track a pulse stream data signal by developing two phase-lock restorative voltages through a phase-locked loop circuit to control the loop voltage controlled oscillator which generates the clock signal. This is accomplished in the phase detector by generating a first voltage developed through an up/down counter and a digital-to-analog converter whenever the phase difference between the two signals exceeds a first threshold. A second voltage, which is designated as the coarse voltage is then generated by combining the fine voltage with a voltage which reduces or increases its value before application to the voltage controlled oscillator. As a result, the altered control voltage rapidly restores phase lock whenever the phase difference exceeds some second greater threshold. This system requires a relatively complex series of gates and delay circuits in the phase detector for accomplishing the desired result. The LaFratta system is not one which is specifically directed to the acquisition mode of operation of a frequency synthesizer type of phase locked loop system.

Another system of the prior art which is directed to an improvement in the acquisition time of a phase locked loop is disclosed in the Perkins, Jr., et al. U.S. Pat. No. 3,495,184, issued Feb. 10, 1970. This patent utilizes a pair of positive and negative slicing circuits connected to the output of the phase detector of the phase locked loop to produce additional pulsating signals which are summed into the output of the loop filter to control the voltage controlled oscillator. This system is limited in its effect since the gain of the system is necessarily reduced because of the pulsating nature of the additional control signals.

Another approach which has been proposed is one shown in the disclosure of the patent to Boelke, U.S. Pat. No. 3,611,175, issued Oct. 5, 1971. This patent primarily is directed to an effort to extend the captive or pull-in range of the phase locked loop system and does so with a complex implementation of an I.F. amplifier and a mixer into the loop in addition to the conventional loop circuit components. The mixer and the I.F. amplifier introduce additional signals into the loop system which require a relatively large number of components in addition to further bistable circuits and gating circuits to accomplish the purpose of extending the pull-in range of the circuit. Accordingly, it is desirable to provide a phase locked loop system suited for use in a frequency synthesizer tuning system which has improved acquisition time combined with loop filtering approaching ideal filtering for steady state conditions of operation.

SUMMARY OF THE INVENTION

Accordingly, it is an object of the present invention to provide an improved phase locked loop system.

It is another object of this invention to provide a phase locked loop system with improved acquisition time.

It is an additional object of this invention to provide a phase locked loop system with improved acquisition time while retaining optimum loop filtering characteristics.

It is a further object of this invention to utilize a frequency discriminator/detector coupled with the output of a voltage controlled oscillator in a phase locked loop system to operate a pair of transmission gates to rapidly force a maximum control signal on the voltage controlled oscillator whenever its frequency is outside a narrow range close to the desired frequency, as determined by the characteristics of the frequency discriminator/detector.

In accordance with a preferred embodiment of the invention, a system is provided for improving the acquisition time of the phase locked loop circuit in which the frequency of a controlled oscillator is locked to that of a reference signal. A phase detector is provided with input signals from the reference signal source and from the output of the controlled oscillator to produce a control signal on its output which is representative of the phase difference between the two signals. This control signal is applied to the control input of the controlled oscillator to control the frequency of operation of the oscillator. A frequency discriminator is coupled to the output of the controlled oscillator and has first and second outputs which in turn are connected to first and second control gates. The control gates are coupled with the output of the phase comparator and operate to supply first and second preestablished potentials to the control input of the controlled oscillator. Operation of the gates is effected by the first and second outputs of the frequency discriminator whenever the frequency of the controlled oscillator is a predetermined amount above a desired frequency or is a predetermined amount below the desired frequency. Whenever either of these conditions exist, one or the other of the outputs of the frequency discriminator supplies a signal to the corresponding control gate to close the gate to supply the proper predetermined control potential to the input of the controlled oscillator.

DETAILED DESCRIPTION

Figure 1:
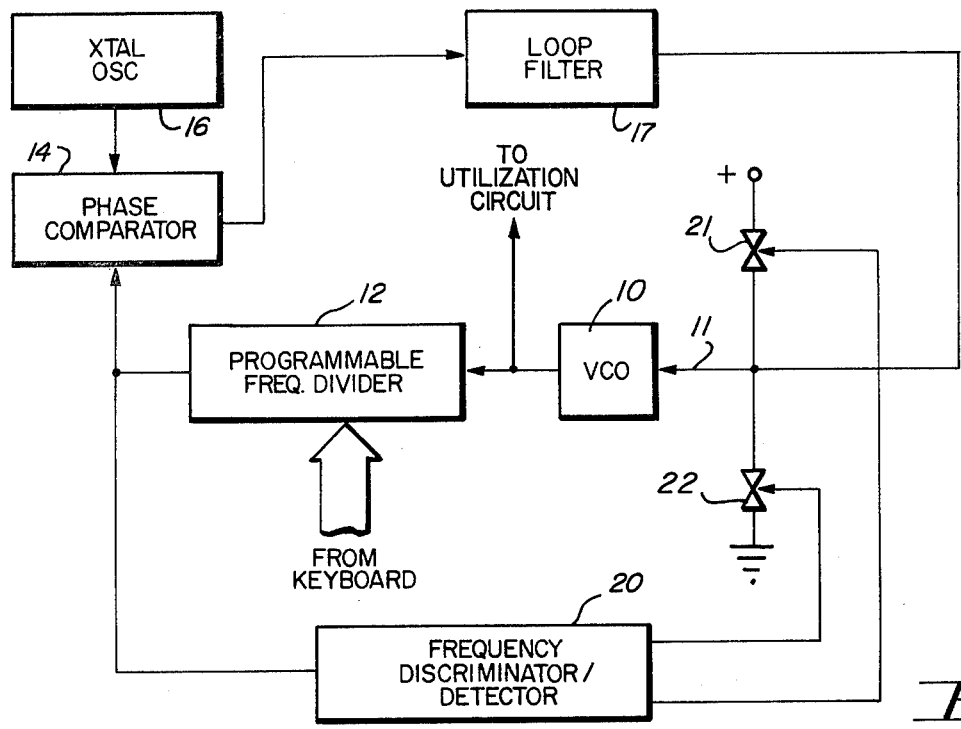
FIG. 1 is block diagram of the preferred embodiment of the system.
Figure 2:
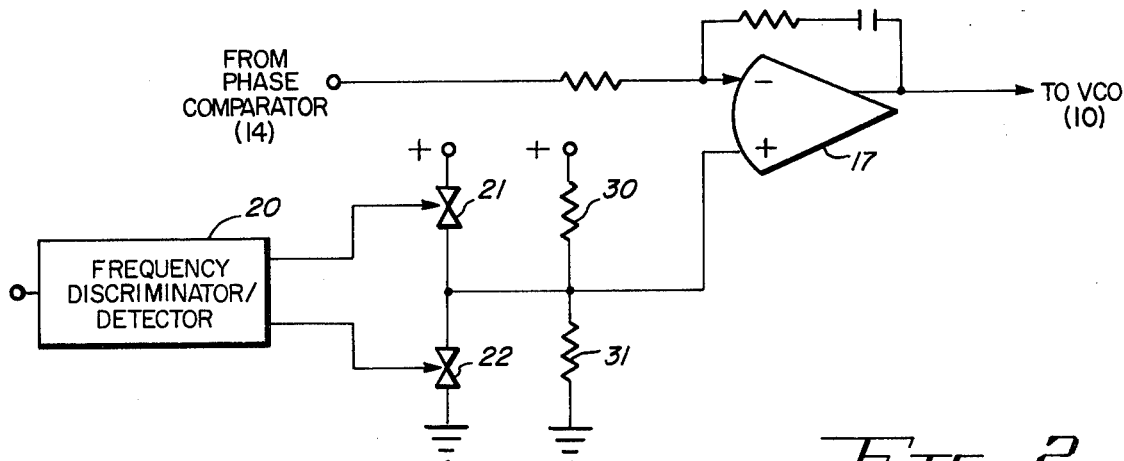
FIG. 2 is a circuit diagram showing an alternative to the embodiment of FIG. 1.

Reference now should be made to the drawing in which the same reference numbers are used in FIGS. 1 and 2 to designate the same or similar components.

FIG. 1 shows a phase locked loop frequency synthesizer system of the type which is particularly suited for use in conjunction with a frequency synthesizer tuning system for a television receiver or the like. Typically, the circuit shown in FIG. 1 may be used in conjunction with the frequency synthesizer tuning system disclosed in U.S. Pat. No. 4,025,953, issued May 24, 1977, and assigned to the same assignee as the present application. The circuit of FIG. 1 also can be used with other types of frequency synthesizer systems in addition to the one shown in that patent, and the system is not limited to use only in conjunction with television tuning systems.

The circuit shown in FIG. 1 includes a voltage controlled oscillator 10 of the type which produces a signal on its output at a frequency determined by the magnitude of a direct current control potential applied to a control input of the oscillator 10 over a lead 11. As illustrated in FIG. 1, the output of the oscillator 10 is supplied through a programmable frequency divider 12 to one of two inputs of a phase comparator 14. The other input to the phase comparator 14 is obtained from a reference frequency signal source in the form of a crystal oscillator 16. In a manner well known, the phase comparator 14 produces a signal on its output which is representative of the phase difference between the two signals applied to its inputs. This signal is supplied through a loop filter 17, the output of which constitutes the desired control voltage applied over the lead 11 to the voltage controlled oscillator 10.

In a typical phase locked loop system, the output of the voltage controlled oscillator 10 is supplied to a utilization circuit. In the case of a television receiver, the utilization circuit comprises the mixer circuit in the tuner for producing the I.F. signal to the I.F. amplifier stages of the receiver. Also in the case of a television receiver, tuning from one channel to the next may be effected from a keyboard or other suitable source to change the count or division ratio of the programmable frequency divider 12 to a ratio corresponding to the next channel to be selected by the system.

Whenever a new division ratio is selected from the receiver keyboard or other suitable source (not shown), the division ratio of the programmable frequency divider 12 is changed from the ratio it previously had. Consequently, if the loop was properly phase and frequency locked prior to the entry of this new division ratio into the divider 12, the entry of the new ratio causes the output of the divider 12 initially to be of a frequency which is different from and which is not phase locked to the frequency of the reference signals supplied by the oscillator 16.

The acquisition time required in order to change the frequency of operation of the voltage controlled oscillator 10 is dependent upon the characteristics of the loop filter 17. Ordinarily, these characteristics are a necessary compromise between the desired rapid acquisition time to change the frequency of the voltage controlled oscillator 10 rapidly when a channel change or frequency change is commanded by a change of the division ratio of the divider 12, and a desired stable steady state operating condition which is provided by having a loop filter with a relatively slow response to changes in the output of the phase comparator 14.

In the past, systems which were capable of compromising these desired characteristics generally did so at the cost of either acquisition time or stable steady state operating conditions. Prior art attempts which were not subject to this undesirable compromise still resulted in relatively complex circuits of the type discussed above in the "Background" portion of this specification.

In order to employ a loop filter 17 which has the desired "steady state" operating characteristics, necessarily causing a relatively slow acquisition time or response time in the circuit, the otherwise conventional phase locked loop circuit of FIG. 1 has been modified by the addition of a frequency discriminator/detector 20 and a pair of transmission gates 21 and 22. The frequency discriminator/detector can be of any number of commercially available types. An ideal type is disclosed in the patent to Theodore S. Rzeszewski, U.S. Pat. No. 4,097,812, issued June 27, 1978. The input to this detector circuit is obtained from the output of the programmable frequency divider 12. When the frequency at the output of the voltage controlled oscillator 10 has the proper frequency and phase relationship with the signal obtained from the output of the crystal oscillator 16, the frequency discriminator/detector 20 is operating in a narrow frequency window, substantially at the desired frequency of operation of the system and both transmission gates 21 and 22 are open and effectively not in the circuit. Whenever the division ratio of the frequency divider 12 is changed by entry of new data from the keyboard (not shown), the frequency applied to the input of the frequency discriminator/detector 20 then suddenly changes, since the voltage controlled oscillator 10 has not had time to change frequency in response to a change in output from the phase comparator 14 applied through the loop to the control input of the oscillator. Consequently, the frequency discriminator detector 20 either detects a frequency which is a fixed amount above the desired frequency or a fixed amount below the desired frequency in accordance with the direction of change of the division ratio of the divider 12. In either event, one or the other of the outputs of the frequency discriminator 20 is provided with an output signal to enable or close the otherwise normally-open transmission gate 21 or 22 with which it is associated. The gate which is closed couples either positive potential, in the case of the gate 21, or ground potential, in the case of the gate 22, directly to the control input on the lead 11 as is readily apparent from an examination of FIG. 1. This rapidly forces the voltage controlled oscillator 10 to change frequency in the direction determined by whichever one of these two potentials is applied to the lead 11 at its maximum rate of change. This occurs irrespective of the rate of change of signal produced by the output of the loop filter circuit 17, since the transmission gates 22 and 22 essentially override the operation of the loop filter during this initial acquisition mode of operation.

As soon as the frequency of the voltage controlled oscillator 10 attains its correct relationship with the frequency of the crystal oscillator source 16, the output of the programmable frequency divider 12 once again is at the desired frequency (which is always the same under steady state operating conditions). This causes the frequency discriminator/detector 20 to operate in its narrow frequency window, so that neither of the two outputs has a signal on it, and both of the transmission gates 21 and 22 are opened. In this condition of operation, the balance of the circuit, exclusive of the detector 20 and the gates 21 and 22 functions as a conventional frequency synthesizer phase locked loop system. When the gates 21 and 22 are used in conjunction with the detector 20, the parameters of the loop filter 17 can be selected to favor the ideal steady state operating characteristics of the system. This normally would result in slow acquisition time, but the use of the frequency discriminator/detector 20 and the two transmission gates 21 and 22 provides optimum rapid acquisition time for the system operation. This is true even through rapid acquisition otherwise is not possible when the loop filter 17 is adjusted to optimize the steady state operating conditions.

The transmission gates 21 and 22 typically may be in the form of field-effect transistor gates which operate as an open circuit when these gates are not enabled and function substantially as short-circuit closed single pole switches whenever such a gate is enabled. Various types of switches or gates, such as bipolar transistors, may be used in order to fulfill the particular design requirements of the system in which they are employed.

Referring now to FIG. 2, there is shown an alternative approach to the circuit illustrated in FIG. 1. It may be more desirable for some applications to effect the control of the rapid acquisition for the circuit at the input to the loop filter 17, rather than at its output. It is especially desirable to effect the control at the input of the loop filter if an active loop filter is used instead of a passive filter. FIG. 2 illustrates the manner in which circuit of FIG. 1 can be modified to do this in conjunction with an active filter.

In FIG. 2, the transmission gates 21 and 22 are connected across the reference input to the active filter 17, which normally is provided with a preestablished reference potential by means of a voltage divider 30 and 31. The input to the frequency discriminator 20 is obtained from the output of the programmable frequency divider 12 in the same manner as described in conjunction with FIG. 1. Similarly, the signal input to the active filter 17 is obtained from the phase comparator 14; and the output of the filter 17 is applied to the input of the voltage controlled oscillator 10. The operation of the circuit is otherwise the same as described above in conjunction with FIG. 1.

Whenever the frequency of the signal at the output of the programmable frequency divider is outside the narrow window of nearly "in-phase" frequency locked signals as detected by the discriminator/detector 20, one or the other of the transmission gates 21 or 22 is closed to apply either a maximum positive or a ground potential, respectively, to the reference input of the filter 17. This changes the filter characteristics, resulting in a rapid change in the output voltage obtained from it to force the voltage controlled oscillator frequency to be rapidly changed in the desired direction. Consequently, the acquisition time of the loop is minimized without sacrificing the desired filtering characteristics of the filter 17 during normal or steady state operation of the system.

Figure 3:
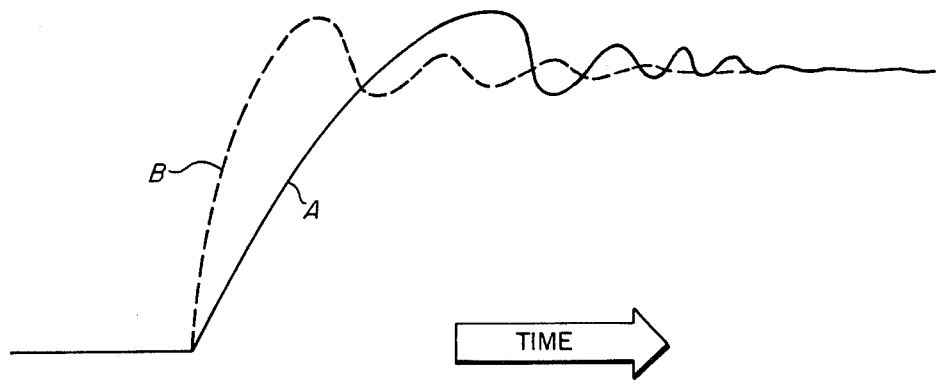
FIG. 3 illustrates waveforms useful in explaining the operation of the circuits shown in FIGS. 1 and 2.

The improved results of the acquisition time effected by either one of the circuits shown in FIGS. 1 and 2 are illustrated in FIG. 3. Waveform A illustrates the acquisition time of a conventional phase locked loop frequency synthesizer system of the type shown in FIG. 1, if the frequency discriminator/detector 20 and the transmission gates 21 and 22 are eliminated or removed from the system. Waveform A shows the typical compromise which is made between rapid acquisition and stable steady state operating conditions. Waveform B, shown in dotted lines in FIG. 3, illustrates the improved acquisition time attainable by the addition of the frequency discriminator detector 20 and the transmission gates 21 and 22, without any degradation in the steady state operating characteristics of the circuit. The waveforms illustrated in FIG. 3, are those which are obtained for a television receiver varactor tuning voltage during channel change, for example from channel 14 to channel 83.

Another addition which may be made to either of the circuits shown in FIGS. 1 and 2 is that the output control signals from the frequency discriminator/detector circuit 20 may be gated through a time controlled gate, so that the circuit is enabled initially with a channel change as detected by a change in the division ratio of the divider 12. At the end of a fixed time period, both of the transmission gates 21 and 22 would be driven open or disabled, irrespective of whether the frequency applied to the input of the frequency discriminator detector 20 was within the narrow window established on either side of the desired tuning frequency. This modification eliminates the possibility of any subsequent oscillations produced by the circuitry from causing undesired sudden swings in the output frequency of the voltage controlled oscillator 10 but still retains the desired characteristics of the fast channel change.

The system described above is one which is ideally suited for use with a frequency synthesizer where a fixed or known reference signal frequency occurs, and changes in the frequency of the output of the voltage controlled oscillator are effected by means of a change in the division ratio of the output frequency of the voltage controlled oscillator prior to applying that output signal to the phase comparator for the synthesizer loop. Although the invention has been described in conjunction with the two specific embodiments illustrated in FIGS. 1 and 2, these embodiments should be considered as illustrative only of the invention and not as limiting. Various changes and modifications may occur to those skilled in the art without departing from the true scope of the invention.

I claim:

1. In a phase-locked circuit in which the frequency of a controlled oscillator means is locked to that of a reference signal, a system for improving the acquisition time including in combination:

first means having first and second inputs and having an output coupled with the control input of said controlled oscillator means, the first input thereof coupled to receive said reference signal and the second input thereof coupled to the output of said controlled oscillator means for producing a control signal on the output thereof representative of the phase difference between said reference signal and the signal produced by said controlled oscillator;

frequency discriminator/detector means coupled with the output of said controlled oscillator and producing a first output signal when the frequency of said controlled oscillator means is a predetermined amount above a desired frequency and producing a second output signal when the frequency of said controlled oscillator means is a predetermined amount below such desired frequency; and first and second control gate means each having a control input coupled to receive respectively, the first and second output signals of said frequency discriminator means and each operated in response to such output signals applied thereto, said first and second control gate means each further coupled with the output of said first means for applying respectively first and second predetermined maximum control potentials to the control input of said controlled oscillator means for overriding the output signals from said first means.

2. The combination according to claim 1 wherein said first and second control gate means comprise first and second normally open transmission gates.

3. The combination according to claim 2 wherein said first transmission gate causes a maximum control potential of one magnitude to be applied to the control input of said controlled oscillator means, and said second transmission gate causes a maximum control potential of another magnitude to be applied to the control input of said controlled oscillator means when said first and second transmission gates are closed, respectively.

4. The combination according to claim 3 further including an active low pass filter means coupled between the output of said first means and the control input of said controlled oscillator means and wherein said first and second transmission gates have outputs thereof coupled in common with said filter means for causing the output of said filter means to vary in accordance with the condition of conductivity of said first and second transmission gate means.

5. The combination according to claim 3 further including loop filter means coupled between the output of said first means and the control input of said controlled oscillator means and wherein said first and second transmission gates have the outputs thereof coupled with the control input of said controlled oscillator means.

6. The combination according to claim 5, wherein said frequency discriminator/detector means has first and second outputs connected, respectively, to the control inputs of said first and second transmission gates, said discriminator/detector means producing said first output signal on said first output thereof when the frequency of said controlled oscillator means is said predetermined amount above a desired frequency and producing said second output signal on the second output thereof when the frequency of said controlled oscillator means is said predetermined amount below such desired frequency.

7. The combination according to claim 1 wherein said controlled oscillator means comprises a controlled oscillator and a programmable frequency divider, with the output of said controlled oscillator coupled with the input of said programmable frequency divider, and the output of said programmable frequency divider coupled with the input of said first means and with the input of said frequency discriminator/detector means.

8. The combination according to claim 7 further including means for changing the division ratio of said programmable frequency divider.

9. The combination according to claim 8 further including low pass loop filter means coupled between the output of said first means and the control input of said controlled oscillator means and wherein said first and second control gate means have the outputs thereof coupled with the control input of said controlled oscillator.

10. The combination according to claim 8 further including an active low pass filter means coupled between the output of said first means and the control input of said controlled oscillator; and wherein said first and second control gate means are coupled with said active loop filter means for causing said active loop filter means to apply said first and second predetermined maximum control potentials to the control input of said controlled oscillator means.

11. The combination according to claim 8 wherein said first and second control gate means comprise first and second transmission gates, respectively, with said first transmission gate coupled between a source of relatively positive potential and the control input of said controlled oscillator means, and with said second transmission gate means coupled between a source of relatively negative potential and the control input of said controlled oscillator means.

12. The combination according to claim 11 wherein said frequency discriminator/detector means has first and second outputs connected, respectively, to the control inputs of said first and second transmission gates, said discriminator/detector means producing said first output signal on the first output thereof when the frequency of said controlled oscillator means is said predetermined amount above a desired frequency and producing a said second output signal on the second output thereof when the frequency of said controlled oscillator means is said predetermined amount below such desired frequency.

13. The combination according to claim 1 wherein said frequency discriminator/detector means has first and second outputs connected, respectively, to the control inputs of said first and second control gate means, said discriminator/detector means producing said first output signal on the first output thereof when the frequency of said controlled oscillator means is said predetermined amount above a desired frequency and producing said second output signal on the second output thereof when the frequency of said controlled oscillator means is said predetermined amount below such desired frequency.

* * * * *